(12) United States Patent     (10) Patent No.: US 9,154,161 B1
Bryant et al.     (45) Date of Patent: Oct. 6, 2015

(54) CALCULATING CYCLIC REDUNDANCY CHECKS OVER OVERLAPPING WINDOWS OF STREAMING DATA

(71) Applicant: Cisco Technology, Inc., San Jose, CA (US)

(72) Inventors: Gregory Alan Bryant, Raleigh, NC (US); Oded Trainin, Ra'anana (IL); Gary Steven Singer, Raleigh, NC (US)

(73) Assignee: Cisco Technology, Inc., San Jose, CA (US)

( * ) Notice: Subject to any disclaimer, the term of this patent is extended or adjusted under 35 U.S.C. 154(b) by 2 days.

(21) Appl. No.: 14/242,524

(22) Filed: Apr. 1, 2014

(51) Int. Cl.
    *H03M 13/09*     (2006.01)
    *H04L 1/00*     (2006.01)

(52) U.S. Cl.
    CPC ............ *H03M 13/09* (2013.01); *H03M 13/091* (2013.01); *H03M 13/093* (2013.01); *H03M 13/096* (2013.01); *H04L 1/0083* (2013.01)

(58) Field of Classification Search
    CPC . H03M 13/09; H03M 13/091; H03M 13/093; H03M 13/096; H04L 1/0083
    See application file for complete search history.

(56) References Cited

U.S. PATENT DOCUMENTS

| 6,701,479 | B2  |   | 3/2004 | Keller |        |
|-----------|-----|---|--------|--------|--------|
| 6,912,683 | B2  | * | 6/2005 | Rifaat et al. | 714/774 |
| 8,001,446 | B2  | * | 8/2011 | Walma | 714/781 |
| 8,156,401 | B2  | * | 4/2012 | King et al. | 714/758 |
| 8,225,187 | B1  |   | 7/2012 | Schultz et al. | |
| 8,433,974 | B2  |   | 4/2013 | Tanaka | |
| 8,634,366 | B2  |   | 1/2014 | Kim et al. | |
| 8,745,476 | B1  | * | 6/2014 | Matiash | 714/807 |
| 2005/0022093 | A1 | | 1/2005 | Murakoshi | |

OTHER PUBLICATIONS

Yan Sun; Min Sik Kim, "A Table-Based Algorithm for Pipelined CRC Calculation," Communications (ICC), 2010 IEEE International Conference on , vol., no., pp. 1,5, May 23-27, 2010.*

Dodds, David E., ATM Framing Using CRC Byte, IEEE International Conference on Communications, May 1994, pp. 410-414, IEEE, Piscataway, United States.

* cited by examiner

*Primary Examiner* — April Y Blair
*Assistant Examiner* — Sazzad Hossain
(74) *Attorney, Agent, or Firm* — Patterson & Sheridan, LLP

(57) ABSTRACT

To calculate sequential CRCs, a CRC pipeline may be used to calculate the sequential CRCs for a block of data The CRC pipeline includes a plurality of stages, where, in each subsequent stage a CRC calculated from a previous stage is used to calculate an offset CRC. For example, using at least one CRC calculator and CRC shifter, a stage in the pipeline removes an effect of first portion of the data represented by a previously calculated CRC from the CRC and then adds an effect of a second portion of data neighboring the first portion in a received data block to yield an offset CRC. For example, a stage may change CRC(0:63) to CRC(32:95) by removing the effect of bytes 0:31 and adding the effect of bytes 64:95. At each stage, the byte offset may get smaller until all the sequential CRCs have been calculated.

20 Claims, 9 Drawing Sheets

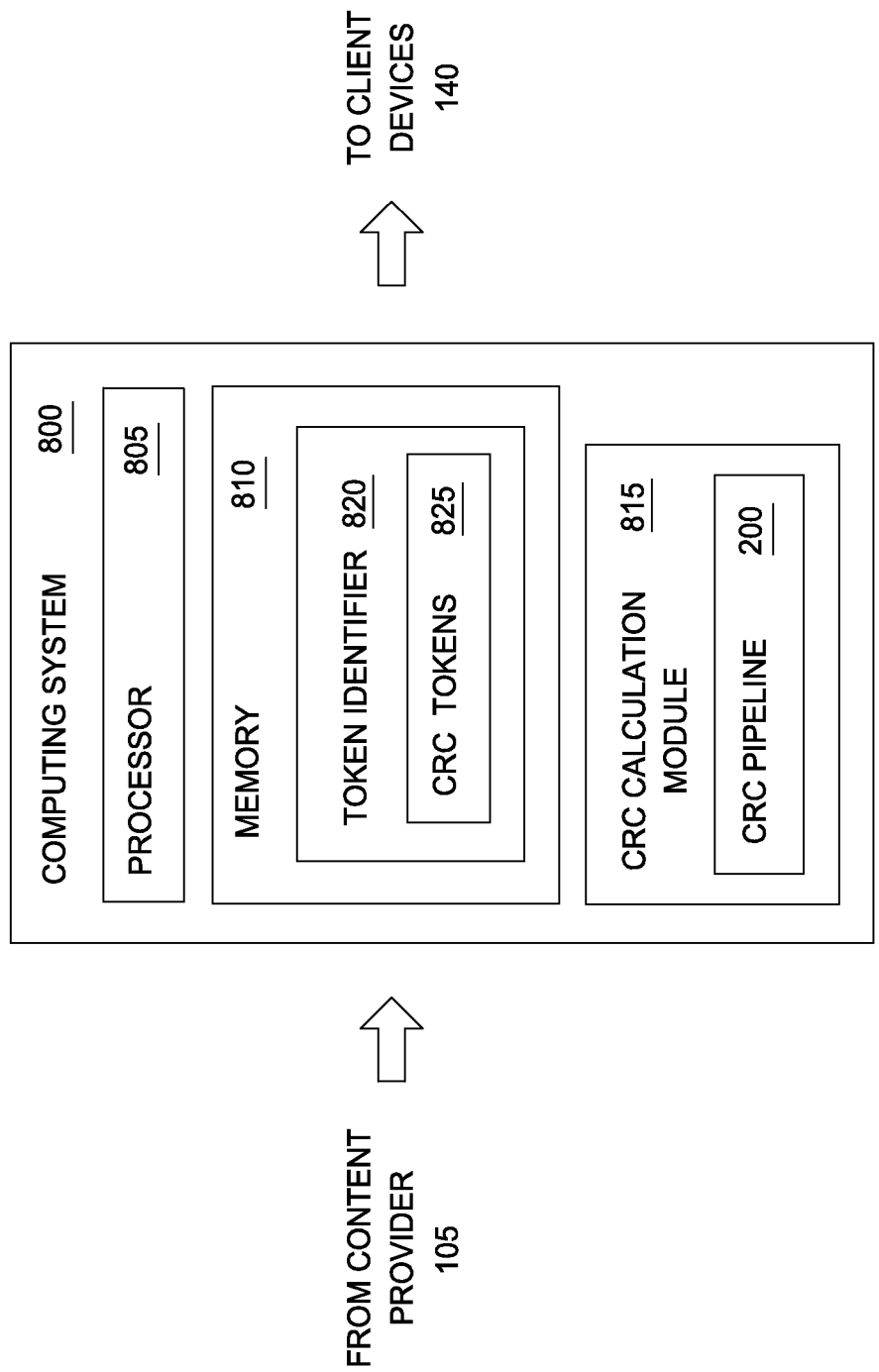

CALCULATING CYCLIC REDUNDANCY CHECKS OVER OVERLAPPING WINDOWS OF STREAMING DATA

TECHNICAL FIELD

Embodiments presented in this disclosure generally relate to calculating cyclic redundancy checks (CRCs) for streaming data, and more specifically, to establishing a pipeline for calculating sequential CRCs representing overlapping portions of a data block.

BACKGROUND

CRC is a type of hash function used to generate a checksum corresponding to a block of data, such as a communication packet. CRC may be used to detect data transmission errors. For example, a CRC value for a packet may be calculated prior to transmitting the packet and after the packet is received at a destination. These CRC values may be compared to detect data transmission errors.

CRCs can be calculated using any number of techniques which may offer different advantages and disadvantages depending on the situation. In hardware implementations, CRCs are calculated using circuit logic on, for example, an integrated circuit which may receive data blocks (e.g., data packets) as input and output CRCs corresponding to each block. Generally, the circuit logic required to calculate CRCs increases as the size of the data block increases. For example, in some implementations, halving the size of the data block being used to calculate the CRC exponentially decreases the size of the circuit logic. Thus, calculating a CRC for a large block of data by combining CRCs representing smaller blocks of data may decrease the overall size of the circuit logic needed.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 8 illustrates a computing system that calculates sequential CRCs, according to one embodiment described herein.

To facilitate understanding, identical reference numerals have been used, where possible, to designate identical elements that are common to the figures. It is contemplated that elements disclosed in one embodiment may be beneficially utilized on other embodiments without specific recitation.

DESCRIPTION OF EXAMPLE EMBODIMENTS

Overview

Figure 1:
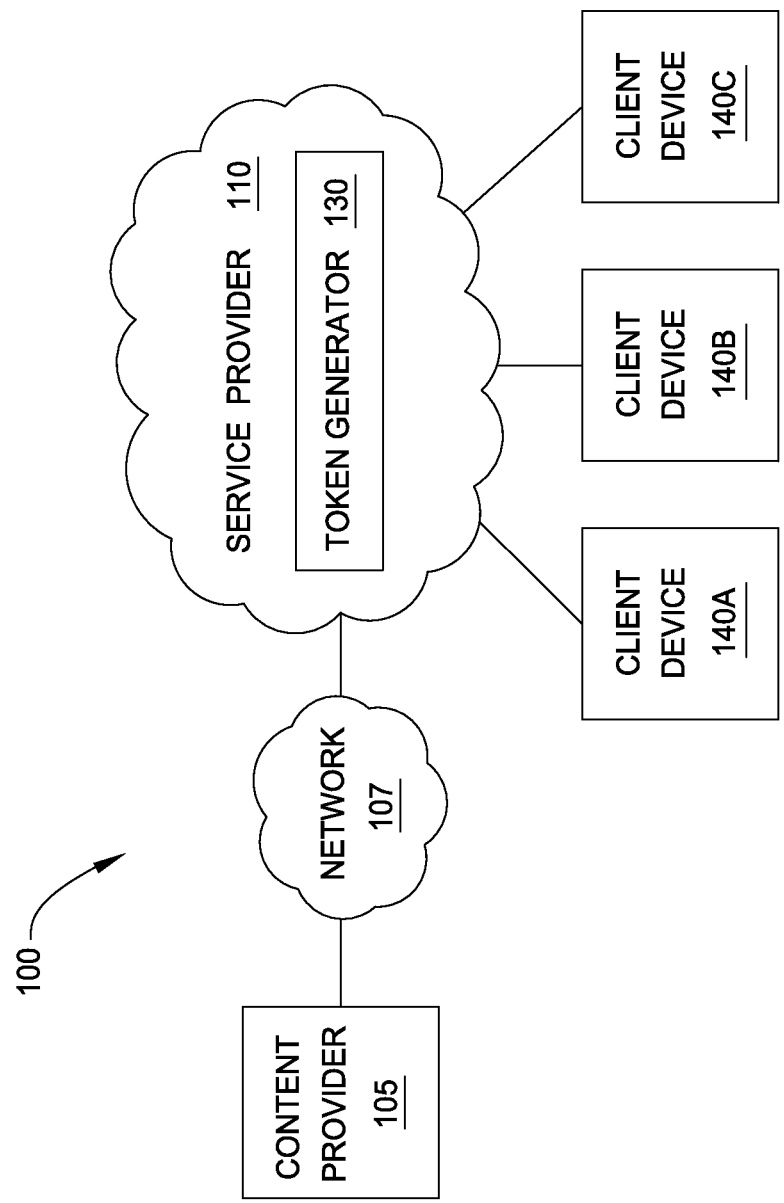
FIG. 1 illustrates a communication system using CRC tokens, according to one embodiment described herein.

One embodiment presented in this disclosure is a CRC pipeline that includes a first stage configured to receive a data block and calculate a first CRC value for a first portion of the data block. The CRC pipeline includes a plurality of subsequent stages configured to calculate a plurality of sequential CRC values representing overlapping portions of the data block. Each of the plurality of subsequent stages includes at least one CRC calculator and CRC shifter configured to modify the first CRC value such that an effect of a sub-portion of the first portion is removed from the first CRC value to yield a temporary CRC value and an effect of a second portion of the data block neighboring the first portion of the data block is added to the temporary CRC value to yield a second, offset CRC value. Furthermore, a data size of the sub-portion and the second portion is the same and defines a predetermined offset value.

Another embodiment presented in this disclosure is a method that includes a first step that calculates, at a first stage in a CRC pipeline, a first CRC value for a first portion of a received data block. The method includes a second step that calculates, at a second stage in the CRC pipeline, a second CRC value using at least one CRC calculator and CRC shifter by modifying the first CRC value such that an effect of a sub-portion of the first portion is removed from the first CRC value to yield a temporary CRC value and adding an effect of a second portion of the received data block neighboring the first portion of the received data block to the temporary CRC value to yield the second CRC value. Furthermore, a data size of the sub-portion and the second portion is the same and defines a predetermined offset value. The method includes a third step of repeating, in one or more subsequent stages in the CRC pipeline, the calculation performed in the second step using a progressively smaller predetermined offset value to calculate a plurality of sequential CRC values representing overlapping portions of the received data block.

Another embodiment presented in this disclosure is an integrated circuit comprising a CRC pipeline. The integrated circuit includes a first stage configured to receive a data block and calculate a first CRC value for a first portion of the data block. The integrated circuit includes a plurality of subsequent stages configured to calculate a plurality of sequential CRC values representing overlapping portions of the data block. Each of the plurality of subsequent stages includes at least one CRC calculator and CRC shifter configured to modify the first CRC value such that an effect of a sub-portion of the first portion is removed from the first CRC value to yield a temporary CRC value and an effect of a second portion of the data block neighboring the first portion of the data block is added to the temporary CRC value to yield a second, offset CRC value. Furthermore, a data size of the sub-portion and the second portion is the same and defines a predetermined offset value.

Example Embodiments

As discussed above, CRCs may be used as error detection codes for detecting transmission errors. In another embodiment, the CRCs may be used as tokens for representing the underlying data block from which they are derived. To calculate a CRC, a data block is shifted into a CRC calculator which outputs the CRC. Although the CRCs are not always unique—i.e., multiple different blocks of data may correspond to the same CRC value—in some situations the CRCs are unique enough to identify the underlying blocks of data. In one example, a computing system can compare a CRC calculated from a newly received data block to a stored CRC. If the CRCs match, the computing system may determine that the new block of data is the same as the block of data associated with the stored CRC.

In one embodiment, a computing system may calculate sequential CRCs representing overlapping portions of a data block. The term "sequential CRCs" is used herein to refer to CRCs that represent overlapping portions of data block (e.g., data portions that include shared data) with a set offset—e.g., 1-byte offset, 2-byte offset, 3-byte offset, etc. Assuming a 128 byte (represented hereinafter by an uppercase "B") of data is received, the computing system may calculate a CRC for B0:B127, a CRC for B1:B128, a CRC for B2:B129 all the way to a CRC for B127:254 to yield sequential CRCs with a 1-byte offset. In one embodiment, to calculate the 128 sequential CRCs, the computing system may include a hardware element that includes 128 CRC calculators. If a 256 byte data block is received, in one clock cycle the 128 byte CRC calculators can output the 128 sequential CRCs. However, the space required on an integrated circuit for 128 CRC calculators that each calculate a CRC for 128 overlapping data portions may be cost prohibitive. Alternatively, the computing system could use a single CRC calculator which calculates a CRC each clock cycle. This would require 128 clock cycles to produce the 128 sequential CRCs. But if the computing system continues to receive new data blocks each clock cycle, the system would fall further and further behind until eventually an input buffer storing the newly received data blocks would overflow.

Instead, the embodiments described herein establish a CRC pipeline that can output 128 sequential CRCs every clock cycle without using 128 parallel CRC calculators. For example, the CRC pipeline establishes a plurality of stages, where, in each subsequent stage a CRC calculated from a previous stage is used to calculate an offset CRC. For example, the CRC(0:63) may be used to calculate CRCs that are a predefined offset from the underlying block of data—e.g., a 32 byte offset. Using this offset, in a subsequent stage, the system calculates CRC(32:95), CRC(64:127), and CRC(96:159). At each stage, the byte offset may get smaller until eventually all the sequential CRCs associated with a received block of data have been calculated. As will be shown in detail below, the advantage of such a CRC pipeline is that leading or trailing zeros may be used to calculate the CRCs. Using this knowledge, the CRC calculators for each stage can be optimized such that the logic in the CRC calculators is reduced relative to the CRC calculators used in the previous stages. That is, although multiple CRC calculators are used, in each stage the circuitry of the calculators is progressively smaller.

FIG. 1 illustrates a communication system 100 using CRC tokens, according to one embodiment described herein. The system 100 includes content provider 105 and a service provider 110 that are connected by a network 107. In one embodiment, the network may be a WAN such as the Internet that permits the content provider 105 and service provider 110 to share data. The content provider 105, for example, may respond to user requests for data from the client devices 140A-C communicatively coupled to the service provider 110. The content provider 105 may begin to stream the requested data (e.g., media presentations, live event stream, stored files, and the like) to the service provider 110 which then forwards the data to the requesting client device 140. However, the service provider 110 (e.g., an Internet Service Provider) may have two client devices 140 requesting the same data from the content provider 105 at the same or different times. To service those requests, the content provider 105 generates two independent data streams on the network 107. Thus, even though the same data is requested (at the same time or different times), the content provider 105 forwards the data twice, thereby using twice the bandwidth.

To avoid sending the same data twice, the service provider 110 includes a token generator 130 which monitors data traffic between the content provider 105 and the client devices 140. In one embodiment, the token generator 130 identifies, based on characteristics of the data traffic, streaming data that may be requested by multiple client devices 140. Once streaming data is identified, the token generator 130 generates CRC tokens representing the data packets of the streaming data. These tokens may then be used by the content provider 105 to identify streaming data that is cached by the service provider 110. If the content provider 105 determines it has transmitted the data previously using the CRC token, instead of sending, for example, 1024 bit data chunks across network 107, the content provider 105 sends the CRC of the 1024 bit data chunk (e.g., 32 bits depending on the CRC implementation) to the service provider 110. Thus, the traffic flowing on network 107 is greatly reduced by sending CRC tokens rather than retransmitting the streaming data.

However, the streaming data may not be precisely the same each time it is requested by the client devices 140. Specifically, the streaming data may have an offset which can be caused by any number of reasons that will not be discussed here. For example, assume client device 140A requests a stream that includes data 0B:1023B. The token generator 130 recognizes this data as streaming data and generates CRC tokens for each 128 block—e.g., CRC(0:127), CRC(128:255), . . . CRC(896,1023)—which are sent to the content provider 105. Later, client device 140B requests the same streaming data but it may be offset by a two bytes. That is, the content provider 105 may generate a data stream of 0B:1025B where the first two bytes is the offset and bytes 2B:1025B are the same as bytes 0B:1023B sent previously to client device 140A. If the content provider 105 simply calculates the CRCs for the second data stream based on the 128 data blocks which the token generator 130 used to generate the CRC tokens, the provider 105 mistakenly concludes the data streams do not contain the same data. That is, CRC(0:127), CRC(128:255), . . . CRC(896,1023) for the second data stream (0B:1025B) are not the same values as CRC(0:127), CRC(128:255), CRC(896,1023) for the first data stream (0B:1023B) because of the two byte offset.

Because the offset may vary each time a new request is received, the content provider 105 may instead calculate each sequential CRC. For example, because it is known the offset may be an integer multiple of a byte (e.g., one byte, two bytes, . . . n-bytes), the content provider 105 may calculate CRC(0:127), CRC(1:128), CRC(2:129), etc. Once the content provider 105 finds a sequential CRC that matches one of the CRC tokens, it then identifies the offset. Based on this offset, the content provider 105 can then see if the rest of the CRCs match the CRC tokens associated with a data stream. Continuing the example above, after the content provider 105 determines that CRC(2:129) of the second data stream (0B:1025B) matches CRC(0:127) of the first data stream (0B:1023B), the content provider 105 determines if CRC(130:253) of the second data stream matches the next CRC token associated with the first data stream (i.e., CRC(128:235)) and so forth. If so, the content provider 105 transmits the matching CRC tokens to the service provider 110 instead of the streaming data itself.

FIG. 1, however, illustrates just one example of a system that may benefit from calculating sequential CRCs for a received block of data. The embodiments described below for calculating sequential CRCs may be used in any computing system for any number of reasons. That is, calculating sequential CRCs may apply to other systems that do not compare the CRCs to already stored CRCs (e.g., the CRC tokens) to identify a common data stream. For example, CRC calculations may be used to identify a pattern that represents the start of a frame in a data stream that is arbitrarily packetized or to detect a denial-of-service attack.

Figure 2:
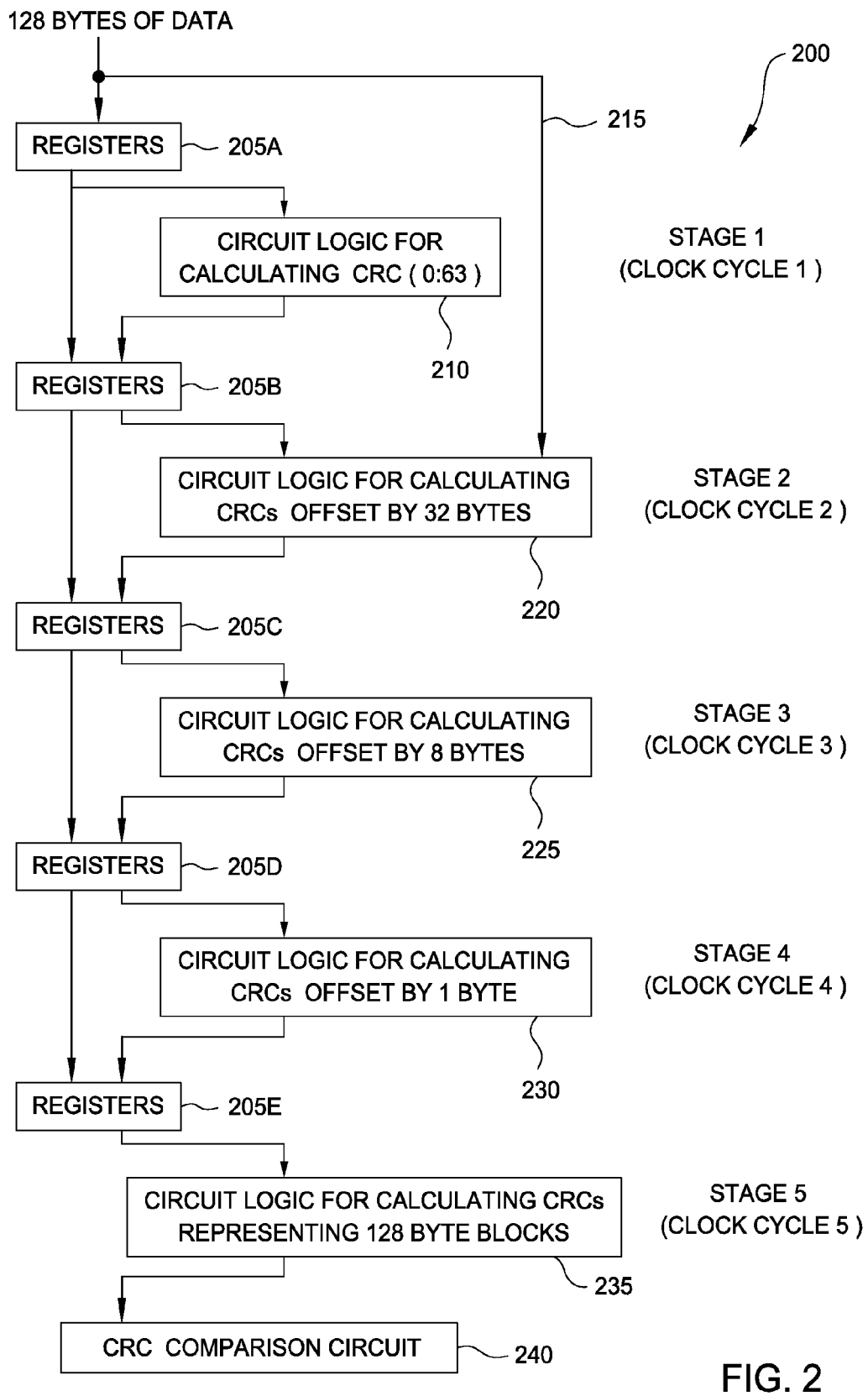
FIG. 2 illustrates a CRC pipeline for calculating sequential CRCs for overlapping portions of a received data block, according to one embodiment described herein.

FIG. 2 illustrates a CRC pipeline for calculating sequential CRCs for overlapping portions of a received data block, according to one embodiment described herein. As shown, the CRC pipeline 200 includes five stages but the pipeline 200 may have more or less than this number. Additionally, each stage corresponds to a single clock cycle of a clock signal driving the hardware elements in the CRC pipeline 200 but this is not a requirement. For example, a stage may require multiple clock cycles in order to complete its associated calculation. Furthermore, in one embodiment, the CRC pipeline 200 may be located on a single integrated circuit or distributed across multiple integrated circuits that are communicatively coupled.

At each clock cycle, a block of data is received at the input of the CRC pipeline 200. In one embodiment, the block of data may be a portion of a data stream where each received block of data is a sequential portion of the stream. In this example, 128B block of data is fed into the CRC pipeline 200 each clock cycle, but this may be any size of data—e.g., 64B, 256B, etc. Furthermore, one of ordinary skill will recognize that using different data chunks may affect the logic performed in each of the stages and affect the number of stages; however, although the basic framework for calculating sequential CRCs remains the same.

The 128 byte data block (referred to herein as "0B:127B") is latched into the registers 205A and transmitted to the circuit logic 210 which calculates a CRC for bytes 0:63 (i.e., CRC (0:63)) of the received block 0B:127B. This process is shown graphically in FIG. 3 which illustrates the first stage of the CRC pipeline 200. As shown there, 0B:63B are inputted into a 64-byte CRC calculator 300 which outputs CRC(0:63). The CRC calculator 300 is not limited to any particular technique for calculating the CRC. In one embodiment, the CRC calculator 300 includes a tree of XOR gates that receives 64 bytes of data input and outputs a corresponding CRC in one clock cycle. The CRC may be any number of bits—e.g., a 16 bit CRC, 32 bit CRC, 64 bit CRC, etc.—and will vary depending on the particular CRC calculator 300 used. Nonetheless, it is assumed that each of the CRC calculators described below output CRCs of the same number of bits.

Returning to FIG. 2, the CRC calculated in the first stage by the circuit logic 210—CRC(0:63)—is stored in registers 205B. In addition, the received data 0B:127B (or portions thereof) is also forwarded and stored in registers 205B. In a second stage, using CRC(0:63) and the received data 0B:127B, the CRC pipeline 200 calculates additional CRCs that are an integer multiple of a predefined offset from the CRC calculated in the first stage. In the embodiment shown here, the CRC pipeline calculates multiple CRCs that are offset by 32 bytes from the CRC(0:63). Stated differently, stage two includes circuit logic 220 that calculates CRCs for the overlapping data blocks 32B:95B, 64B:127B, and 96B: 159B—CRC(32:95), CRC(64:127), and CRC(96:159). The 32 byte offset is just one offset that could be used. For example, the offset may be chosen based on how much time is needed for the circuitry logic 220 to output a CRC. As smaller offsets are used (i.e., more CRCs are calculated in the same cycle), the more time is required. Thus, there may be a limit (depending on the speed of the transistors used) of the number of CRCs that can be calculated in one cycle. Thus, for this implementation, the offset of 32 bytes is chosen because the corresponding CRCs can be calculated in one clock cycle. However, if faster transistors were used, at stage two a 16 byte offset may be used instead in which case the circuit logic 220 would calculate CRC(16:79), CRC(32:95), CRC(48:111), CRC(64:127), CRC(80:143), CRC(96:159), and CRC(112: 175).

Because the circuit logic 220 calculates CRC(95:159), CRC pipeline includes a bypass path 215 that permits the data received in subsequent clock cycles to be forwarded to the second stage. That is, because the next received data block (i.e., 128B:255B) includes data that is used to calculate CRC (95:159) 128B:159B), at least a portion of the subsequently received data may be forwarded to the second stage using path 215 which bypasses the first stage. Thus, using the data blocks received in two sequential clock cycles, the circuit logic 220 calculates CRCs offset by 32 bytes from the CRC calculated in stage 1.

Figure 3:
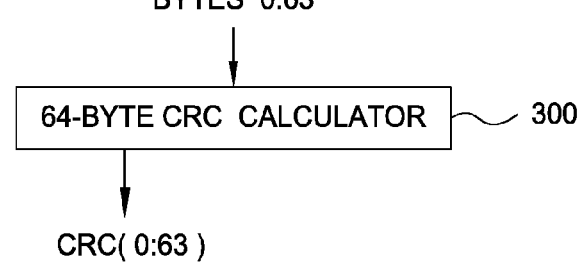
FIG. 3 illustrates a first stage of the CRC pipeline, according to one embodiment described herein.
Figure 4A:
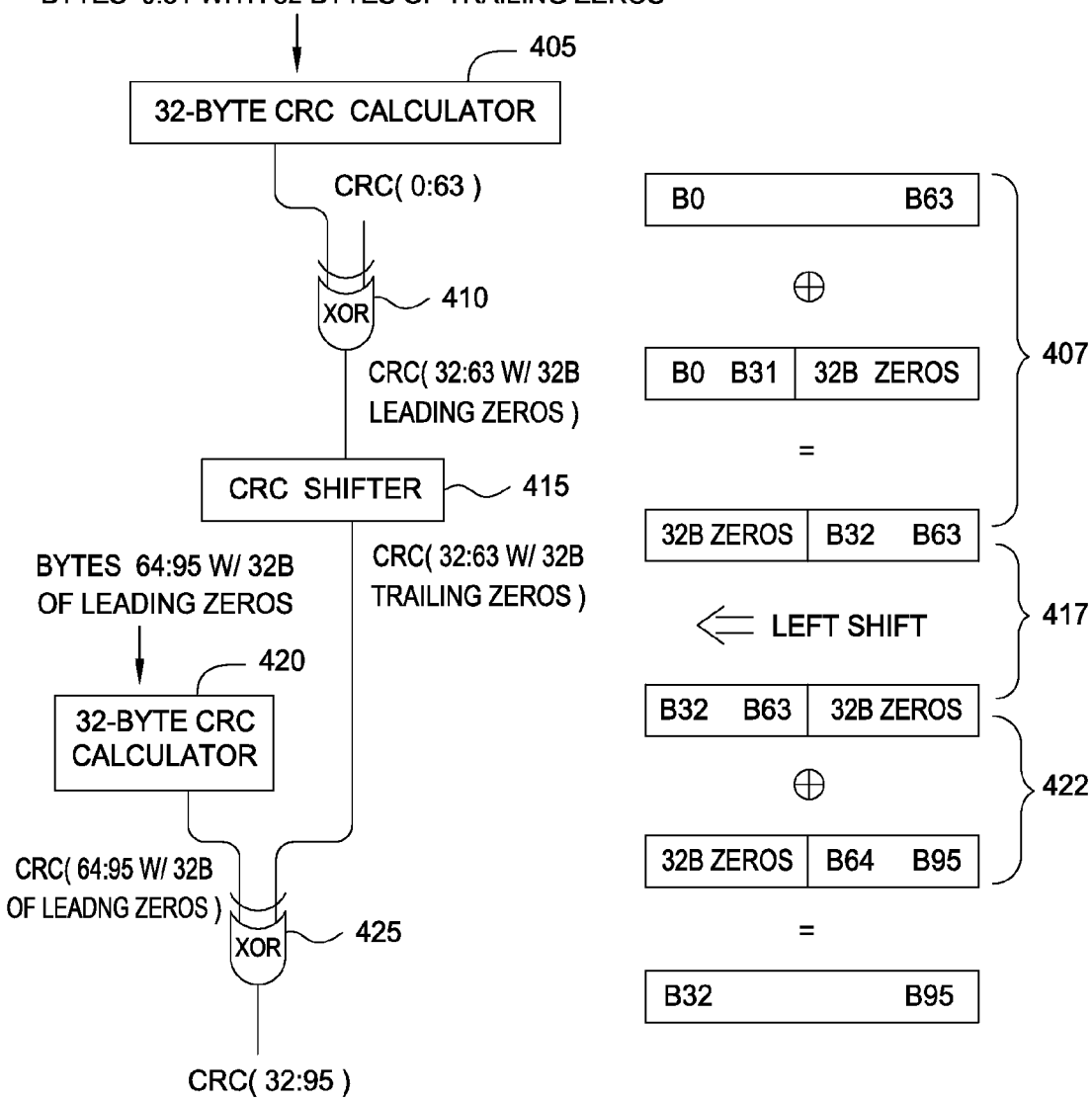
FIGS. 4A-4C illustrate portions of a second stage of the CRC pipeline, according to embodiments described herein.
Figures 4B, 4C:
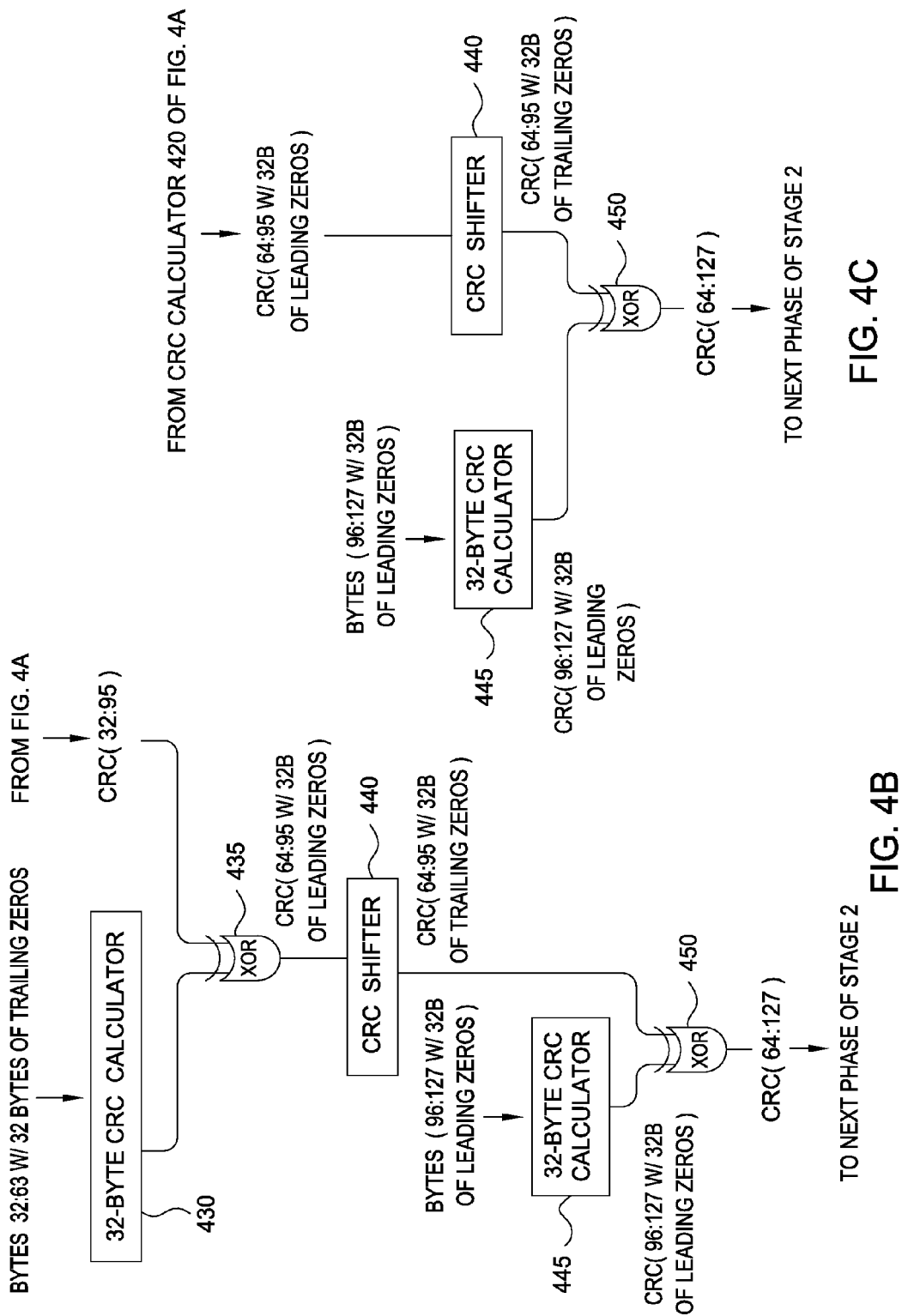

FIGS. 4A-4C illustrate portions of a second stage of the CRC pipeline, according to embodiments described herein. Specifically, FIGS. 4A-4C illustrate different embodiments of circuitry that may be used to calculate the offset CRCs. As shown in FIG. 4A, a portion of the received data block (i.e., 0B:31B) that includes 32 bytes of trailing zeros is fed into a 32-byte CRC calculator 405. Because half of the 64 bytes are zeros, the logic of the CRC calculator 405 can be greatly simplified or optimized relative to the logic in the CRC calculator 300 in FIG. 3. Both of these CRC calculators 300, 405 both output the same sized CRC (e.g., 32 bits) but the logic in CRC calculator 405 is much less than in the CRC calculator 300. To illustrate this difference, the calculator 405 is labeled as a 32 byte CRC calculator to represent that only 32 bytes of its input is received data while the other 32 bytes are trailing zeros. Generally, as the number of trailing zeros is increased, the size of the CRC calculators (i.e., the amount of circuitry needed to calculate the CRC) decreases exponentially. Thus, using twice the number of zeros means the CRC calculator can be four times smaller.

The CRC calculator 405 outputs the CRC representing 0B:31B with 32 bytes of trailing zeros (i.e., CRC(0:31, with 32B trailing zeros). This CRC is used as a first input to the XOR logic 410 while the CRC calculated in stage 1 (i.e., CRC(0:63) is used as the second input. To increase understanding, the right hand side of FIG. 4A illustrates performing the same logic on the received data block 0B:127B that is being performed by the circuitry on the left hand side of FIG. 4A except that the right hand side does not show calculating CRCs. For example, step 407 illustrates XORing 0B:B64 with the data block 0B:31 B with 32 bytes of trailing zeros. Because XORing data with itself results in a zero, the first 32 bytes of data (i.e., 0B:31B) are removed from the data block. Because XORing data with zeros does not change the data, the last 32 bytes of data (32B:63B) are unaffected. The result of step 407 is 32 bytes of leading zeros combined with 32B: 63B.

If the result of step 407 were passed through a CRC calculator, the output would be the exact same as the output of the XOR logic 410 on the left side of FIG. 4A. That is, first XORing data and then taking the CRC is equivalent to first calculating the CRCs and then XORing those CRCs. This relationship is shown by the following equation:

$$CRC(M1 \oplus M2) = CRC(M1) \oplus CRC(M2) \quad (1)$$

The CRC outputted from the XOR logic 410 is then transmitted to a CRC shifter 415 which alters the CRC from a CRC representing 32B:63B with 32 bytes of leading zeros to a CRC representing 32B:63B with 32 bytes of trailing zeros. This is shown on the left side by operation 417 where instead of have 32 bytes of leading zeros, a 32 byte left shift is performed so that the data block has 32 bytes of trailing zeros. The CRC shifter 415 includes circuit logic that alters the incoming CRC to represent the bit shifted data block with 32 bytes of trailing zeros rather than 32 bytes of leading zeros. Because the output of the CRC shifter 415 only of the initial state of the 32 CRC bits rather than the data used to calculate the CRC, the shifter 415 includes less logic than a CRC calculator that accepts 32 bytes of random data.

The shifted CRC representing 32B:63B with 32 bytes of trailing zeros and is inputted into the XOR logic 425 along with the output of the 32-byte CRC calculator 420 which calculates CRC(64:95, with 32B of leading zeros). Similar to CRC calculator 405, CRC calculator 420 uses much less circuitry than the 64 byte CRC calculator 300 shown in FIG. 3. Unlike trailing zeros, however, leading zeros do not affect CRC calculations. As such, in one embodiment, the CRC calculator 420 may use only 32 bytes of input since the 32 bytes of leading zeros can be ignored.

Operation 422 illustrates the XOR logic being performed by XORing the CRCs output from the CRC shifter 415 and the CRC calculator 420. In this example, the data portion 32B:63B is added to the data portion 64B:95B to form the data block B32:B95. Thus, the output of the XOR logic 425 is precisely the same as taking the CRC of the result of operation 422—i.e., CRC(32:95). The advantage, however, of using the circuitry found in the left side of FIG. 4A rather than the operations shown in the right side of is that a 64 byte CRC calculator is avoided. That is, performing the operations using CRCs rather than the received data means that the amount of circuitry required may be reduced. Even though the left side of FIG. 4A illustrates using two CRC calculators 405, 420, and a CRC shifter, this logic may be much less than the single 64 byte CRC calculator that would be required using the operations shown on the right side of FIG. 4A to determine CRC(32:95).

In sum, the operation performed by the circuitry in FIG. 4A uses the additive and subtractive properties of the XOR operation to remove a first portion of the data block and then add a second portion of the data block. In the example shown, the effect of 0B:31B of the CRC is removed while the effect of 64B:95B is added to form a new CRC representing 32B:95B. The left shift operation 417 is used to line up the data blocks so that the second portion can be added to the remaining portion of the data block after the first portion is removed. Instead of performing these operations on the received data, Equation 1 and the left side of FIG. 4A illustrates doing the equivalent operations using CRCs of the received data.

FIG. 4B illustrates a second phase of stage 2 of the CRC pipeline. Here, the same basic technique performed in FIG. 4A to determine CRC(32:95) is used to determine CRC(64:127). As shown, a 32 byte CRC calculator 430, which may be the same as the CRC calculator 405 in FIG. 4A, determines the CRC representing 32B:63B with 32 bytes of trailing zeros. This CRC is then sent to the XOR logic 435 along with the CRC(32:95) that was outputted from XOR logic 425 in FIG. 4A. In this manner, the output of the first phase, which is shown in FIG. 4A, is used to determine the CRC of the second phase shown in FIG. 4B.

The CRC outputted from XOR logic 435 is then altered by the CRC shifter 440 to yield a CRC representing 32B:63B with 32 bytes of trailing zeros instead of 32 bytes of leading zeros. A second 32-byte CRC calculator 445 (which may be the same as the CRC calculator 420 in the first phase) is used to calculate the CRC representing 96B:127B with 32 bytes of leading zeros. These two CRCs are fed into XOR logic 450 which outputs CRC(64:127). Although not shown, CRC(64:127) may then be used by a third phase of stage two to calculate CRC(96:159) in a similar manner. That is, the circuitry of the third phase may be the same circuitry used in the first two phases shown in FIGS. 4A and 4B. Thus, the three phases may be daisy chained such that the CRC output of one phase is an input to another phase. Moreover, the third phase uses the bypass path 215 shown in FIG. 2 since this phase is tasked with calculating the CRC for 95B:159B which relies on data received in a subsequent clock cycle—i.e., data block 0B:127B is received in the first clock cycle while 128B:255B is received in the second clock cycle and is fed forward to the third phase of stage two using path 215.

As stated above, in one embodiment, the offset between the CRCs calculated at each phase (shown here as 32 bytes) is set so that there is enough time for all the phases to calculate their corresponding CRCs. Specifically, in stage two, the offset was selected so that in one clock cycle, the three daisy chained phases can stabilize and output the correct CRCs—CRC(32:95), CRC(64:127), CRC(96:159).

FIG. 4C illustrates a different embodiment of the second phase of stage two illustrated in FIG. 4B. Because the input of the CRC shifter 440 in FIG. 4B is the same as the output of the CRC calculator 420 in the first phase shown in FIG. 4A (i.e., a CRC representing 64:95 with 32B of leading zeros), instead of using CRC calculator 430 and XOR logic 435 to calculate this same value, the output of CRC calculator 420 from the first phase may be fed forward to the CRC shifter 440. Stated differently, the output of CRC calculator 420 may be split and forwarded to the input of the CRC shifter 440 in the second phase as well as to the XOR logic 425 in the first phase. As a result, CRC calculator 430 and XOR logic 435 may be omitted from the second phase. This same optimization may also be applied to the third phase—i.e., the output of the CRC calculator 445 may be fed forward to the CRC shifter used in the third phase.

In one embodiment, the three phases of stage two of the CRC pipeline output, in one clock cycle, the CRCs of 32B:95B, 64B:127B, and 96B:159B. If the phases are optimized as shown in FIG. 4B, only four 32 byte CRC calculators and three CRC shifters are used (along with the various XOR logic which is very small in comparison) to calculate the three CRCs. In contrast, without this technique, three parallel 64-byte CRC calculators would be needed to determine the CRCs in one clock cycle.

Returning to FIG. 2, the output of the second stage is latched in registers 205C and is then fed into the circuit logic 225 during the third stage of the pipeline 200. During the third stage, the circuit logic 225 calculates the CRCs with a different, smaller offset than the offset used in second stage. In this example, the integer multiples of an 8 byte offset is used to calculate CRC(8:71), CRC(16:79), CRC(24:87), CRC(40:103), CRC(48:111), CRC(56:119), CRC(72:135), CRC(80:143), CRC(88:151), CRC(104:167), CRC(112:175), and CRC(120:183). As discussed below, CRC(0:63), CRC(32:95), CRC(64:127), and CRC(96:159), which were calculated in the first and second stages, are used to calculate the CRCs with the 8 byte offsets in stage three.

Figure 5A:
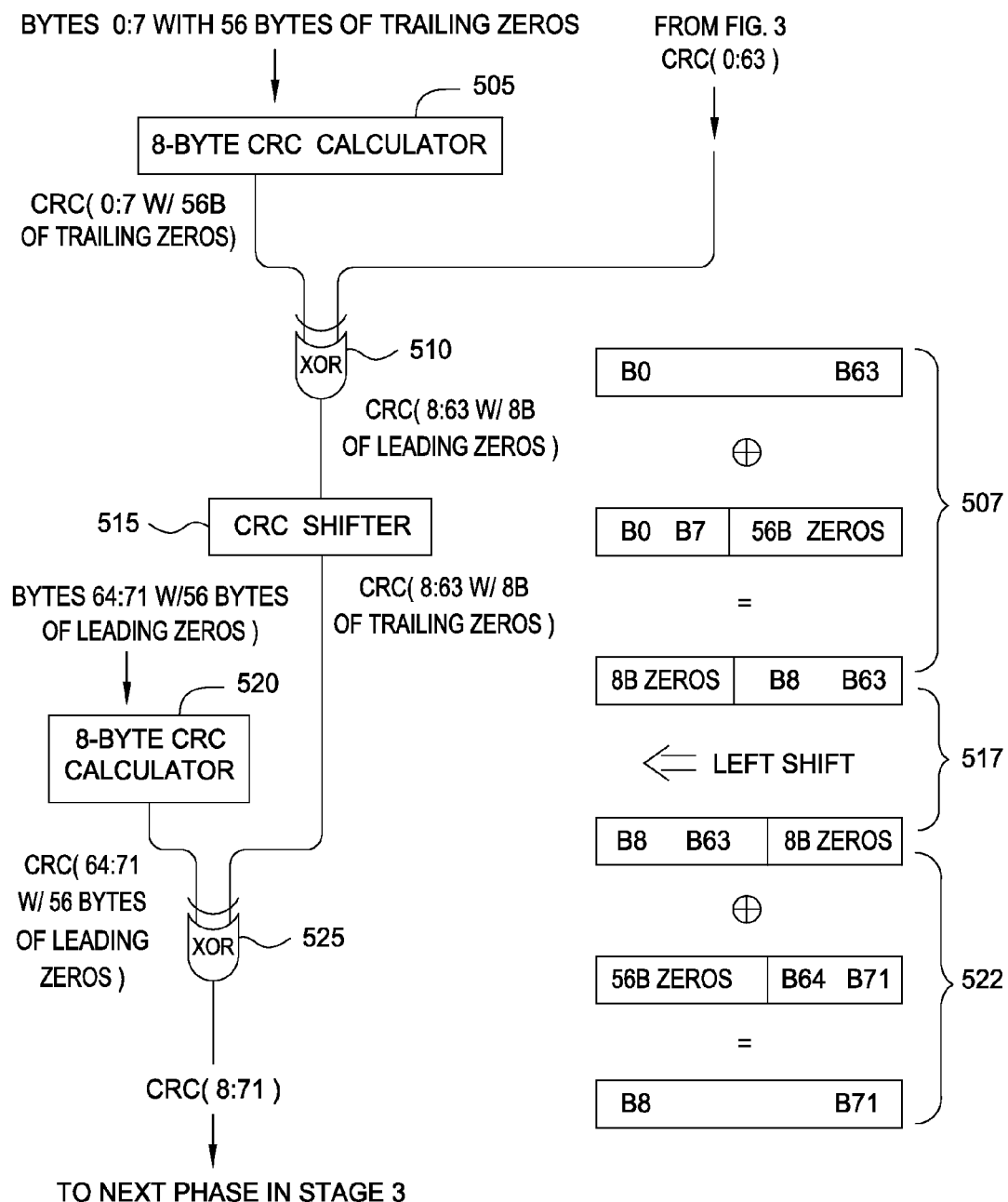
FIGS. 5A-5B illustrate portions of a third stage of the CRC pipeline, according to embodiments described herein.
Figure 5B:
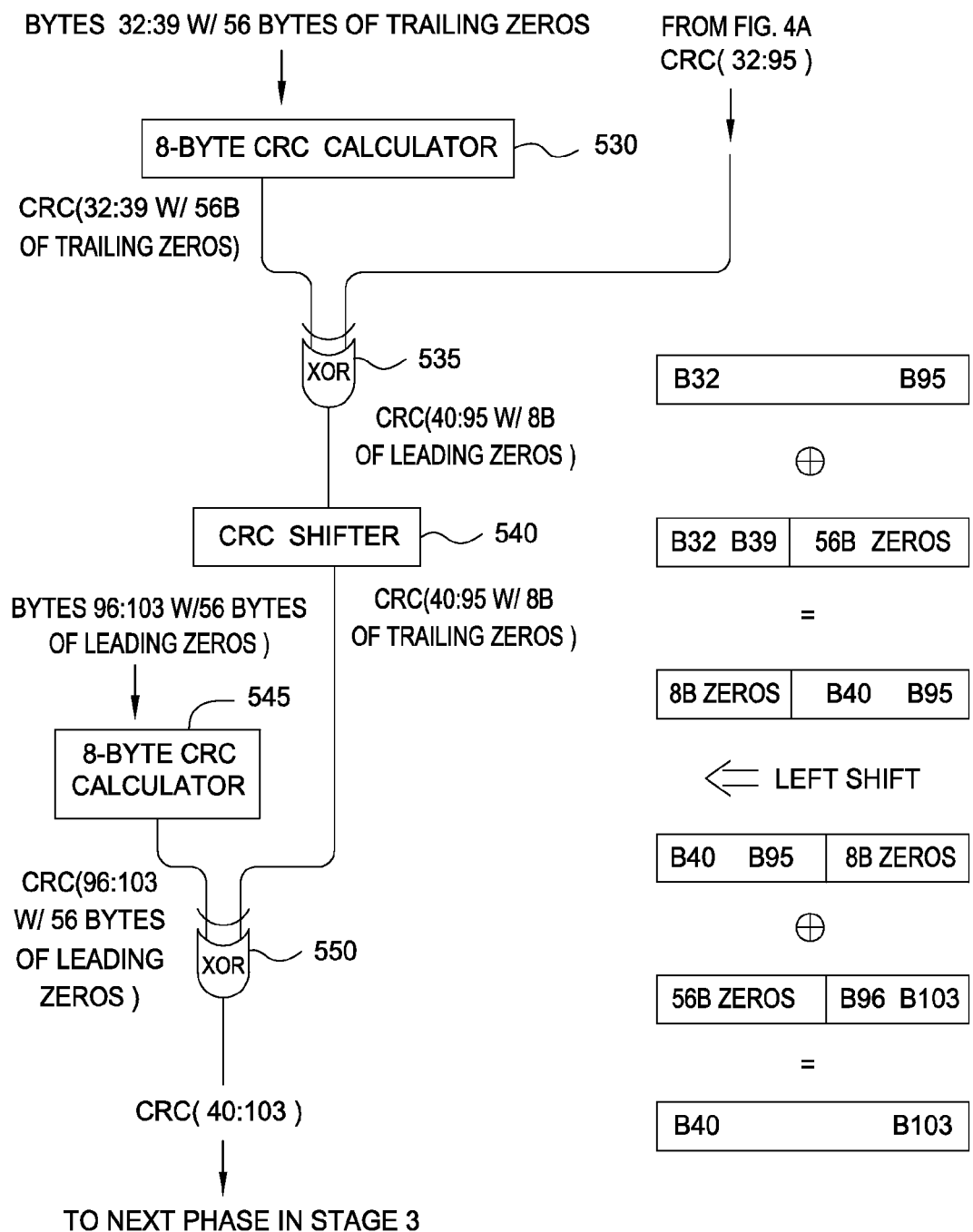

FIGS. 5A-5B illustrate portions of the third stage of the CRC pipeline, according to embodiments described herein. As shown, FIG. 5A illustrates a first phase in the third stage that calculates CRC(8:71) using CRC(0:63) calculated in the first stage of the CRC pipeline. FIG. 5A includes an 8 byte CRC calculator 505 that generates the CRC representing 0B:7B with 56 bytes of trailing zeros. Although the CRC calculator 505 includes a 64 byte input, because 56 of these bytes are known to be zeros, the logic required to calculate the CRC can be greatly reduced relative to the 64-byte or 32-byte CRC calculators used in the previous stages. This CRC is then fed into the XOR logic along with the CRC(0:63) calculated in first stage of the CRC pipeline. Operation 507 shown on the right side of FIG. 5A illustrates that performing the logic on the CRCs is similar to masking off the first 8 bytes of data and leaving only the remaining 56 bytes of data with 8 bytes of leading zeros.

The CRC shifter 515 then alters the CRC from representing 8B:63B with 8 bytes of leading zeros to representing 8B:63B with 8 bytes of trailing zeros which is shown by operation 517. This CRC is then used as an input to XOR logic 525 along with the CRC determined by the 8-byte CRC calculator 520. Specifically, the CRC outputted from CRC calculator 520 represents 64B:71B with 56 bytes of leading zeros. By XORing these two CRCs using XOR logic 525, the result is CRC(8:71). As shown by operation 522 on the right side of FIG. 5A, the next 8 bytes are added to the data block 8B:63B. Again, the circuitry shown in FIG. 5A, which is similar to the circuitry used in FIGS. 4A and 4B, avoids using a 64 byte CRC calculator. Instead, only two 8 byte CRC calculators 505 and 520 along with a CRC shifter 515 are used.

Although not shown in the Figures, the output of the first phase in stage three—i.e., the output of XOR logic 525—is passed to subsequent phases. Specifically, CRC(8:71) is then used as an input to a second phase that performs a similar technique as shown in FIG. 5A to calculate CRC(16:79). The CRC value calculated in the second phase is then used as an input to the third phase to calculate CRC(24:87). Thus, as discussed above, the three phases may be daisy chained where the outputs of each of the phases stabilize within one clock cycle. In one embodiment, the circuitry of the second and third phases may be optimized as shown in FIG. 4C where an output of a circuit module in a previous phase may be fed forward to a circuit module in a subsequent phase. In such a case, the circuitry of the first phase in the daisy chained phases may be different from the latter phases.

FIG. 5B illustrates a parallel circuit path in the third stage. More specifically, FIG. 5A illustrates the first phase of a first parallel circuit path while FIG. 5B illustrates a first phase in a second parallel circuit path in the third stage. Moreover, the two parallel circuit paths may be independent of each other. That is, both circuit paths can perform their calculations in parallel (e.g., they are not daisy chained). FIG. 5B includes the same circuitry as FIG. 5A but uses CRC(32:95) as an input rather than CRC(0:63). The 8 byte CRC calculator 530 outputs the CRC representing 32B:39B with 56 bytes of trailing zeros. This CRC is fed into the XOR logic 535 along with CRC(32:95) which removes the effect of 32B:40B from the CRC. The CRC shifter 535 then alters the CRC to represent a data block with 8 bytes of trailing zeros rather than leading zeros. Another 8 byte CRC calculator 545 calculates the CRC of 96B:103B with 56 bytes of leading zeros which is then used, along with the output of CRC shifter 540, as input to XOR logic 550. The result is the CRC representing 40B:103B.

Although not shown, this second parallel circuit path also includes second and third stages that may be daisy chained to calculate CRC(48:111) and CRC(56:119), respectively. That is, in one clock cycle, both the first parallel circuit path and the second parallel circuit path in stage three determine six CRCs which are integer multiples of the 8 byte offset using two different CRCs calculated in the previous stages.

Moreover, the third stage also includes third and fourth parallel circuit paths which may have the same circuitry and phases as described in FIGS. 5A and 5B. However, the third and fourth parallel circuit paths use CRC(64:127) and CRC(96:159) as inputs, respectively. Thus, in one clock cycle the third parallel circuit path calculates CRC(72:135), CRC(80:143), and CRC(88:151) using its three phases while the fourth parallel circuit path calculates CRC(104:167), CRC(112:175), and CRC(120:183) using its three phases. In this manner, in one embodiment, the third stage of the CRC pipeline includes four independent parallel circuit paths that each include three daisy chained phases that each output a CRC that is an integer multiple of the 8-byte offset during a single clock cycle. However, although the third stage uses an 8 byte offset, in other embodiments, it may be designed using a different offset. For example, if the circuitry used is too slow to calculate the CRCs within one clock cycle, a 16 byte offset may be used. This will reduce the number of phases in the four parallel circuit data paths though it may increase the total number of stages in the CRC pipeline. Alternatively, a 1 byte offset may be used though this increases the number of phases in each of the four parallel circuit paths but it may mean one less stage in the overall pipeline.

Returning to FIG. 2, the CRCs calculated in stage 3 by circuit logic 225 are latched into registers 205D. In the next clock cycle (Stage 4), these CRCs along with the 128 bytes of received data (and at least some portion of the 128 byte data block received in the following clock cycle) are forwarded to the circuit logic 230 which calculates the CRCs using a 1 byte offset. That is, in stage 4, the CRC pipeline 200 calculates all the CRCs representing 64 bytes of the received data at 1 byte intervals that were not calculated in the previous stages. As such, during this stage, the pipeline 200 calculates CRC(1:64), CRC(2:65), CRC(3:66), CRC(4:67), CRC(5:68), CRC(6:69), CRC(7:70), CRC(9:72), CRC(10:73), CRC(127:190). Thus, at the end of stage 4, the CRC pipelines has calculated sequential CRCs with a 1 byte offset representing 128 overlapping 64-byte blocks of the received data—i.e., CRC(0:63)—CRC(127:190).

Figure 6:
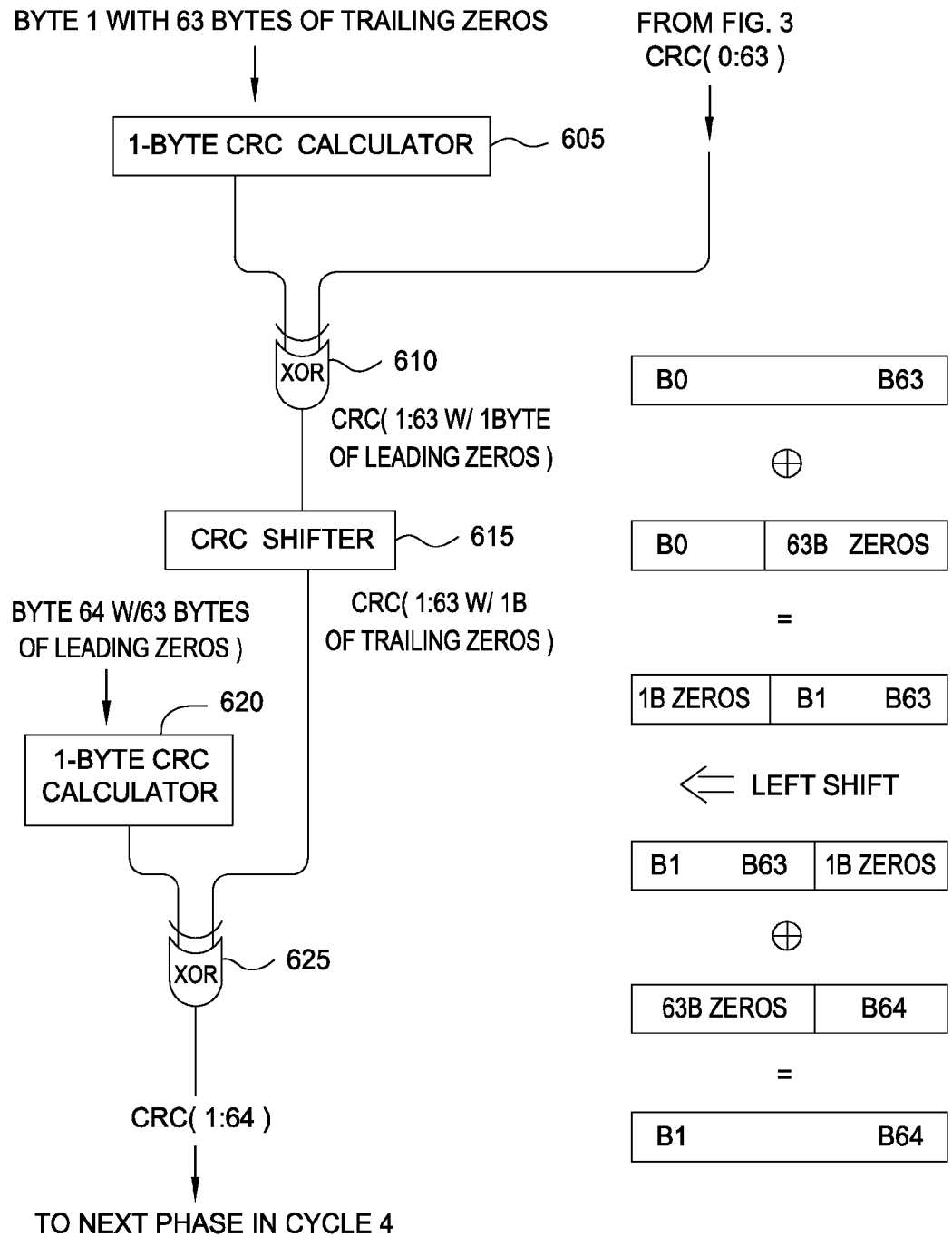
FIG. 6 illustrates a portion of a fourth stage of the CRC pipeline, according to one embodiment described herein.

FIG. 6 illustrates a portion of a fourth stage of the CRC pipeline 200 shown in FIG. 2, according to one embodiment described herein. Like in stage 3, stage 4 is divided into a plurality of independent parallel circuit paths. In the present embodiment, the CRC pipeline includes an independent parallel circuit path for each of the CRCs calculated in the previous stages—CRC(0:63), CRC(8:71), CRC(16:79), CRC(120:183). Therefore, stage 4 includes 16 parallel circuit paths. Moreover, each circuit path would include seven phases for calculating the seven CRCs between the CRCs calculated in the previous phase. For instance, in the previous stages, the CRC pipeline calculated CRC(0:63) and CRC(8:71). In stage 4, each independent circuit path calculates the seven CRCs between the CRCs which are each separate by 8 bytes—e.g., CRC(1:64), CRC(2:65), CRC(3:66), CRC(4:67), CRC(5:68), CRC(6:69), and CRC(7:70).

FIG. 6 includes the first phase of the first parallel circuit path in the CRC pipeline. As such, CRC(0:63), which was calculated in the first state, is used a first input into the XOR logic 610 while the output of the 1-byte CRC calculator 605 is used as a second output. As shown, the input to the CRC calculator 605 is byte 1 of the received data and 63 bytes of trailing zeros. Because the CRC calculator 605 always receives data that has 63 bytes of trailing zeros, the logic within the calculator 605 can be greatly reduced relative to the 64-32- and 8-byte CRC calculators discussed in the previous figures.

The output of the XOR logic 610 is a CRC representing 1 B:64B with 1 byte of leading zeros. Using CRC shifter 615, this CRC is manipulated to instead represent 1B:64B with 1 byte of trailing zeros. The 1-byte CRC calculator 620 receives byte 65 of the received data as an input and calculates the CRC representing byte 65 with 63 bytes of leading zeros. When these two CRCs are inputted into the XOR logic 625, the output is CRC(1:64). That is, the circuitry in FIG. 6 removes the influence of byte 0 of the received data from CRC(0:63) and adds in byte 64 to the CRC calculation. This shown using XOR logic in the right side of FIG. 6. Thus, manipulating the CRCs as shown in the circuitry on the left yields the same result as if the XOR logic on the right side of FIG. 6 were performed and the CRC of 1 B:64B was then calculated.

Although not shown, the CRC calculated in the phase shown in FIG. 6 is then forwarded to the other six phases in the first parallel circuit path to calculate the remaining sequential CRCs—CRC(2:65), CRC(3:66), CRC(4:67), CRC(5:68), CRC(6:69), and CRC(7:70). Concurrently, the other fifteen parallel circuit paths may be calculating the CRCs discussed above. Although stage 4 includes more parallel circuit paths and more phases in each of the circuit paths, the circuitry used is less than what be required to produce the same number of CRCs using the logic in stage 1 as shown in FIG. 3. That is, the circuitry needed for enough 64-byte CRC calculators to simultaneously generate the CRCs calculated in stage 4 is much more than all the CRC calculators and CRC shifters used in stage 4. However, this is not a requirement. In one embodiment, the CRC pipeline may be designed such that the circuitry in one stage is greater than the circuitry used in a previous stage. Nonetheless, by using smaller and smaller offsets to calculate the CRCs at each stage, the CRC pipeline can use much less circuitry than 128 parallel CRC calculators to calculate 128 sequential CRCs during a single clock cycle, albeit the CRCs are delayed a few clock cycles from when the corresponding block of data is received. That is, the CRC pipeline 200 receives the 128 byte block of data at a first clock cycle and four clock cycles later has completed calculating the 128 sequential CRCs each representing a 64-byte block of data.

Returning to FIG. 2, the CRCs calculated in stage 4 are latched into the registers 205E. The CRC pipeline 200 also includes stage 5 which includes circuit logic for calculating sequential CRCs representing 128 bytes of data rather than 64 byte of data. That is, at stage 5, the pipeline 200 converts CRC(0:63), CRC(1:63), CRC(127:190) to CRC(0:127), CRC(1:128), CRC(127:254). To do so, logic 235 may include a plurality of CRC shifters that align the CRCs representing neighboring blocks of the input data that are to be combined to form a CRC representing 128 bytes rather than only 64 bytes. For example, to form CRC(0:63), a CRC shifter can shift CRC(0:63) to a CRC representing 0B:63B and 64 bytes of trailing zeros. This is then XOR'd with CRC(64:127) to yield CRC(0:127). Note that CRC(64:127) does not need to be sent through a CRC shifter since leading zeros may not affect the CRC calculation—i.e., the CRC representing 64B:127B is the same as the CRC representing 64B:127B with 64 bytes of leading zeros.

In one embodiment, at stage 5 some additional CRCs are calculated for some of the combinations of 64 byte CRCs. For example, to determine CRC(127:254), the logic 235 combines CRC(127:190) with CRC(191:254); however, CRC (191:254) was not calculated in the previous stages. To determine this CRC, the logic 235 may include a plurality of 64-byte CRC calculators. Alternatively, the CRC pipeline can feed forward the results from stage 4 to stage 5 since the 128 sequential CRCs representing 64-byte chunks of received data block 128B:255B will have all been calculated at the end stage 4 of the pipeline 200. Thus, these CRCs (one of which will be CRC191:254) can be fed forward and combined with the 128 sequential CRCs representing 0B:127B to form the 128 sequential CRCs representing 128 byte chunks—i.e., CRC(0:127), CRC(1:128), CRC(127:254). Because the logic needed to combine the CRCs to represent 128 byte chunks is a simple calculation, feeding forward the result of stage 4 can be performed without incurring a delay. In one embodiment, in a similar manner as described above, additional stages may be added to combine the CRCs representing the 128 bytes of received data to calculate the CRCs representing 256 bytes of received data.

As shown by CRC pipeline 200, after some delay (a four clock delay in this non-limiting example) the CRC pipelines outputs 128 sequential CRCs each clock cycle (assuming a new 128 byte data block is received each clock cycle). These sequential CRCs are then fed into a CRC comparison circuit 240 which determines if any of the sequential CRCs match the stored CRC tokens. That is, the CRC pipeline 200 may be used in the system discussed in FIG. 1 to identify the identical, but offset, data streams. For instance, if the CRC(3:66) matches a stored CRC token, the CRC pipeline can stop executing and use this offset (e.g., 3 bytes) to determine if CRC(66:129) matches the next CRC token, and so forth. If so, the system can determine that the data streams are the same except for a three byte offset. In one embodiment, the CRC comparison circuit 240 may not be hardware in the CRC pipeline 200 but may instead be performed by software. In this case, the sequential CRCs are provided to a software application to determine if they match the stored CRC tokens. However, this is just one example of a system that could benefit from the CRC pipeline 200 to identify sequential CRCs each clock cycle without requiring large, parallel CRC calculators.

The embodiments above described identifying sequential CRCs where the offset is 1 byte. In other examples, the possible offset may be different (e.g., the offset may be an integer multiple of 4 bytes rather than an integer multiple of 1 byte). In that case, instead of calculating sequential CRCs offset by one byte—e.g., CRC(0:127), CRC(1:127), etc.— the pipeline 200 would be reconfigured to calculate sequential CRCs offset by 4 bytes—e.g., CRC(0:127), CRC(4:131), etc.

Figure 7:
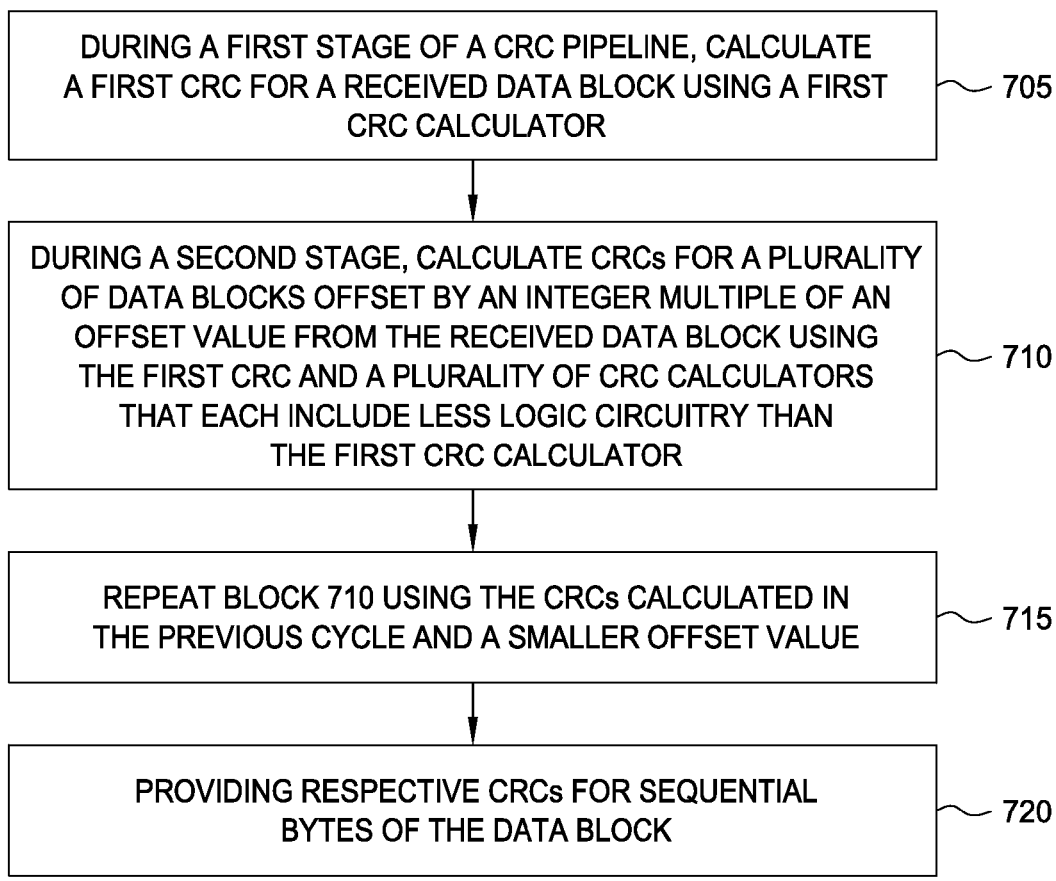
FIG. 7 illustrates a method of calculating sequential CRCs for a block of data, according to one embodiment described herein.

FIG. 7 illustrates a method 700 of calculating sequential CRCs for a block of data, according to one embodiment described herein. At block 705, during a first stage, the CRC pipeline calculates a first CRC for a received data block using a first CRC calculator. In one embodiment, the CRC represents a first portion of the received block of data (e.g., the CRC representing data 0B:64B of a received 128 byte block of data).

At block 710, during a second stage, the CRC pipeline calculates CRCs for a plurality of data blocks offset by an integer multiple of an offset value from the received data block using the first CRC and a plurality of CRC calculators. The offset may be any desired value. In one embodiment, the offset is selected such that the CRCs calculated in the second stage may be calculated in one clock cycle.

Generally, the operation performed by the circuitry in the second stage uses the additive and subtractive properties of the XOR operation to remove a first portion of the data block and then add a second portion of the data block. In the example shown in FIG. 4A, the effect of 0B:31B of the CRC is removed while the effect of 64B:95B is added to form a new CRC representing 32B:95B. The left shift operation 417 is used to line up the data blocks so that the second portion can be added to the remaining portion of the data block after the first portion is removed. Instead of performing these operations on the received data, Equation 1 and the left side of FIG. 4A illustrates doing the equivalent operations using CRCs of the received data.

In one embodiment, the second stage of the pipeline may include a plurality of daisy chained phases where latter phases in the daisy chain uses the CRC calculated from the previous phase to calculate the next CRC according to the second stage's predetermined offset. For example, if the received data block includes 64 bytes (0B:63B), an offset of 16 bytes may be used to calculate CRC(16:48), CRC(32:63), and CRC(48:79). Based on the circuitry shown in FIGS. 4A-4B, each of these 16-byte offset CRCs may be calculated in respective phases wherein the CRC calculated in the previous stage is used to determine the CRC in the subsequent phase. To do so, leading and trailing zeros are used to calculate new CRCs using CRC calculators that include less circuitry than CRC calculators used in previous stages. For example, in stage 1, a 32-byte CRC calculator is used to calculate CRC(0:31) but only 16-byte CRC calculators are used to calculate the CRCs in stage 2. In addition to using one or more CRC calculators, each phase may include a CRC shifter which aligns the CRCs with the leading and trailing zeros such that XORing these CRCs result in the desired CRC.

At block 715, the process used in block 710 is repeated using a smaller offset and the CRCs calculated in the previous stage. That is, in stage three, instead of using a 16 byte offset an 8 byte, 4 byte, or 1 byte offset may be used. Moreover, instead of having a single data path, the third stage may have a plurality of data paths that each includes one or more phases. Continuing the previous example, there would be four independent parallel circuit paths—one for each of the CRCs calculated previously—but the number of phases in each of these paths varies depending on the offset. For instance, using the 8 byte offset results in each circuit path having only one phase while a 4 byte offset results in two phases in each circuit path. Nevertheless, in one embodiment, the logic performed in each phase in a circuit path is the same even if the circuitry in the phases may be different to take advantage of optimizations such as the optimization shown in FIG. 4C. Block 715 may be repeated (i.e., additional stages can be added) as required in order to yield the sequential CRCs for a received block of data.

In one embodiment, each stage may be one clock cycle of the clock used to drive the circuit elements used in each of the stages. That is, the number of phases in the circuit paths may be limited by the time required by the data signals to propagate through the circuitry as well as the complexity of the circuitry itself. That is, a 64-byte CRC calculator may take a much longer time to stabilize and output the desired CRC than smaller CRC calculators. Thus, as the complexity of the CRC calculators and CRC shifters decreases by using the techniques described above, the offset in each phase can shrink even though this increases the number of phases in each independent parallel circuit path.

At block 720, the CRC pipeline provides the sequential CRCs for use by other circuit components. Using method 700, the CRC pipeline outputs the sequential CRCs for a received block of data each clock cycle albeit there is a predefined delay before the CRCs are ready. However, for every clock cycle thereafter, the CRC pipeline continues to output sequential CRCs associated with a different received block of data.

FIG. 8 illustrates a computing system 800 that calculates sequential CRCs, according to one embodiment described herein. The computer system 800 includes a processor 805, memory 810, and a CRC calculation module 825. The processor 805 represents any number of processors or processing elements (e.g., multiple cores in a single processor). Memory 810 includes volatile memory (e.g., DRAM), non-volatile memory (e.g., Flash memory or hard disk drives), or combinations thereof. As shown, memory 810 includes a token identifier 820 which may be an application that determines whether a data stream provided by the content provider 105 matches the CRC tokens 825. If CRCs representing the data stream do match the CRC tokens 825, the token identifier 120 may send data packets containing the CRC tokens 825 to the downstream service provider (not shown) which then provides a cached copy of the data stream to the client devices 140. Stated differently, in one embodiment, the CRC tokens 825 enable the computing system 800 to determine whether the same data stream has already been cached by the service provider, and thus, the data stream does not need to be retransmitted to the service provider. The CRC tokens 825, which are much smaller than the data packets associated with the data stream, are sent instead.

To calculate the CRCs of the data stream to determine if they match the CRC tokens 825 stored in memory 810, the computing system 800 includes a CRC calculation module 815 and the CRC pipeline 200 discussed above. In one embodiment, the CRC calculation module 815 is one or more integrated circuits that include the circuitry of the CRC pipeline 200. In another embodiment, the CRC calculation module 815 may be a field-programmable gate array (FPGA) board or other programmable logic device that is programmed using, for example, a hardware description language to implement the CRC pipeline 200.

The CRC calculation module 815 receives the streaming data from the content provider 105, processes the data using the CRC pipeline 200, and outputs the sequential CRCs to the token identifier 820 which then determines if any of the sequential CRCs match the CRC tokens 825. In one embodiment, the CRC calculating module 815 may include a comparison circuit for determining if the sequential CRCs match the CRC tokens 825—i.e., the comparison is done using hardware in module 815 rather than using the token identifier 820 which may be software or firmware. In this embodiment, the token identifier 820 may provide the CRC tokens 825 to the CRC calculation module 815 or the tokens 825 may be stored on memory elements within module 815.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

As will be appreciated by one skilled in the art, the embodiments disclosed herein may be embodied as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality and operation of possible implementations of systems, methods and computer program products according to various embodiments. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In view of the foregoing, the scope of the present disclosure is determined by the claims that follow.

We claim:

1. A cyclic redundancy check (CRC) pipeline comprising:
   a first stage configured to receive a data block and calculate a first CRC value for a first portion of the data block; and
   a plurality of subsequent stages configured to calculate a plurality of sequential CRC values representing overlapping portions of the data block, wherein each of the plurality of subsequent stages comprises at least one CRC calculator and CRC shifter configured to modify the first CRC value such that an effect of a sub-portion of the first portion is removed from the first CRC value to yield a temporary CRC value and an effect of a second portion of the data block neighboring the first portion of the data block is added to the temporary CRC value to yield a second, offset CRC value, wherein a data size of the sub-portion and the second portion is the same and defines a predetermined offset value.

2. The CRC pipeline of claim 1, wherein at least one of the plurality of subsequent stages includes a first CRC calculator and a first CRC shifter in a first phase and a second CRC calculator and second CRC shifter in a second phase, wherein the first phase is configured to calculate the second CRC value and the second phase is configured to modify the second CRC value such that an effect of a sub-portion of the data represented by the second CRC value is removed and an effect of a third portion of the data block neighboring the data represented by the second CRC value is added to yield a third, offset CRC value, wherein a data size of the sub-portion of the data represented by the second CRC value and the third portion of the data block is the same as the predetermined offset value.

3. The CRC pipeline of claim 1, wherein each of the subsequent stages includes at least two CRC calculators,
wherein a first one of the at least two CRC calculators is configured to output a first intermediate CRC value representing a third portion of the data block padded with trailing zeros, the first intermediate CRC value is combined with a received CRC value to remove an effect of the third portion from the received CRC value and yield a second intermediate CRC value which is inputted into the CRC shifter,
wherein a second one of the at least two CRC calculators is configured to output a third intermediate CRC value representing a fourth portion of the data block neighboring data represented by the received CRC value, the third intermediate CRC value is combined with an output of the CRC shifter to add the effect of the fourth portion of the data block and yield an offset CRC value.

4. The CRC pipeline of claim 1, wherein at least one of the plurality of subsequent stages includes a plurality of independent parallel circuit paths, each of the independent parallel circuit paths comprises a respective CRC calculator and a respective CRC shifter, each of the independent parallel circuit paths is configured to calculate CRC values using an obtained CRC value received from a previous stage in the CRC pipeline.

5. The CRC pipeline of claim 4, wherein each of the plurality of independent circuit paths include at least two phases, wherein each of the at least two phases comprises at least one CRC calculator and at least one CRC shifter, and wherein the at least two phases are daisy chained such that an output CRC value calculated by a first one of the at least two phases is used by a second one of the at least two phases to calculate a different output CRC value, wherein both the output CRC value and the different output CRC value are one of the sequential CRC values.

6. The CRC pipeline of claim 1, wherein each of the plurality of subsequent stages calculates at least two of the plurality of sequential CRC values using a respective predetermined offset value, wherein the respective predetermined offset value for each stage in the CRC pipeline is less than the respective predetermined offset values used in previous stages in the CRC pipeline.

7. The CRC pipeline of claim 1, where each stage in CRC pipeline completes execution in one clock cycle.

8. The CRC pipeline of claim 1, wherein the CRC pipeline is disposed on an integrated circuit.

9. The CRC pipeline of claim 1, wherein each of the overlapping portions represented by the sequential CRC values contains data shared by at least one other overlapping portion of the data block and each of the overlapping portions are offset by a same data offset value.

10. The CRC pipeline of claim 1, wherein the at least one CRC calculator in each of the plurality of subsequent stages contain less circuitry than one or more CRC calculators used in a previous stage.

11. A method comprising:
(i) calculating, at a first stage in a CRC pipeline, a first CRC value for a first portion of a received data block;
(ii) calculating, at a second stage in the CRC pipeline, a second CRC value using at least one CRC calculator and CRC shifter by:
modifying the first CRC value such that an effect of a sub-portion of the first portion is removed from the first CRC value to yield a temporary CRC value, and
adding an effect of a second portion of the received data block neighboring the first portion of the received data block to the temporary CRC value to yield the second CRC value, wherein a data size of the sub-portion and the second portion is the same and defines a predetermined offset value; and
(iii) repeating, in one or more subsequent stages in the CRC pipeline, the calculation performed in step (ii) using a progressively smaller predetermined offset value to calculate a plurality of sequential CRC values representing overlapping portions of the received data block.

12. The method of claim 11, wherein at least one of the subsequent stages includes a first CRC calculator and a first CRC shifter in a first phase and a second CRC calculator and second CRC shifter in a second phase, wherein the calculation in step (ii) is repeated in both the first phase and second phase using a same predetermined offset value, wherein the first phase uses the first CRC value to perform the calculation in step (ii) but the second phase uses a CRC value outputted from the first phase.

13. The method of claim 11, wherein the second stage includes at least two CRC calculators, and wherein calculating the second CRC value at the second stage in the CRC pipeline comprises:
calculating, using a first one of the at least two CRC calculators, a first intermediate CRC value representing the sub-portion of the first portion of the received data block padded with trailing zeros;
combining the first intermediate CRC value with the first CRC value to remove an effect of the sub-portion from the first CRC value and yield a second intermediate CRC value;
calculating a shifted CRC value of the second intermediate CRC value using the CRC shifter;
calculating, using a second one of the at least two CRC calculators, a third intermediate CRC value representing the second portion of the received data block; and
combining the shifted CRC value and third intermediate CRC value to add the effect of the second portion of the data block and yield the second CRC value.

14. The method of claim 11, wherein at least one the subsequent stages includes a plurality of independent parallel circuit paths, each of the independent parallel circuit paths comprises a respective CRC calculator and a respective CRC shifter, each of the independent parallel circuit paths calculates CRC values using at least two CRC values received from a previous stage in the CRC pipeline.

15. The method of claim 14, wherein each of the independent parallel circuit paths comprises at least two daisy chained phases, where an output CRC value from a first of the phases is used as an input to a second one of the phases.

16. The method of claim 11, wherein the first stage, the second stage, and the one or more subsequent stages complete execution in one clock cycle.

17. The method of claim 16, further comprising:
receiving, at the first stage, one of a plurality of sequential data blocks of a data stream each clock cycle; and
outputting a set of sequential CRCs values for each of the sequential data blocks each clock cycle in a plurality of sequential clock cycles.

18. The method of claim 11, wherein each of the overlapping portions represented by the sequential CRC values contains data shared by at least one other overlapping portion of the received data block, and each of the overlapping portions are offset by a same data offset value.

19. The method of claim 11, further comprising, before adding the effect of the second portion to the temporary CRC value, altering the temporary CRC value using the CRC shifter such that the temporary CRC value represents a different sub-portion of the first portion with trailing zeros instead of representing the different sub-portion of the first portion with leading zeros.

20. An integrated circuit comprising a CRC pipeline, the integrated circuit comprising:
a first stage configured to receive a data block and calculate a first CRC value for a first portion of the data block; and
a plurality of subsequent stages configured to calculate a plurality of sequential CRC values representing overlapping portions of the data block, wherein each of the plurality of subsequent stages comprises at least one CRC calculator and CRC shifter configured to modify the first CRC value such that an effect of a sub-portion of the first portion is removed from the first CRC value to yield a temporary CRC value and an effect of a second portion of the data block neighboring the first portion of the data block is added to the temporary CRC value to yield a second, offset CRC value, wherein a data size of the sub-portion and the second portion is the same and defines a predetermined offset value.

* * * * *